US010770257B2

(12) United States Patent
Kengoyama et al.

(10) Patent No.: US 10,770,257 B2
(45) Date of Patent: Sep. 8, 2020

(54) SUBSTRATE PROCESSING METHOD

(71) Applicant: ASM IP Holding B.V., Almere (NL)

(72) Inventors: Yuko Kengoyama, Kawasaki (JP);
Takashi Yoshida, Fuchu (JP)

(73) Assignee: ASM IP Holding B.V., Almere (NL)

(*) Notice: Subject to any disclaimer, the term of this patent is extended or adjusted under 35 U.S.C. 154(b) by 0 days.

(21) Appl. No.: 16/040,755

(22) Filed: Jul. 20, 2018

(65) Prior Publication Data
US 2020/0027685 A1 Jan. 23, 2020

(51) Int. Cl.
| | |
|---|---|
| *H05H 1/46* | (2006.01) |
| *H01J 37/02* | (2006.01) |
| *C23C 16/56* | (2006.01) |
| *C23C 16/509* | (2006.01) |
| *H01L 21/687* | (2006.01) |
| *H01L 21/3065* | (2006.01) |
| *H01L 21/31* | (2006.01) |

(52) U.S. Cl.
CPC .......... *H01J 37/026* (2013.01); *C23C 16/509* (2013.01); *C23C 16/56* (2013.01); *H01L 21/68742* (2013.01); *H01J 2237/0041* (2013.01); *H01J 2237/3321* (2013.01); *H01L 21/3065* (2013.01); *H01L 21/31* (2013.01)

(58) Field of Classification Search
CPC ............. C23C 14/5826; C23C 16/458; C23C 16/4583; C23C 16/505; C23C 16/509; C23C 16/5096; C23C 16/517; C23C 16/56; H01J 37/026; H01J 37/32082–32091; H01J 2237/004; H01J 2237/0041; H01J 2237/0044; H01J 2237/3321; H01J 2237/3322; H01J 2237/334–3343; H01J 2237/335–2237/3387; H01L 21/3065; H01L 21/68742; H01L 21/68764

USPC ....... 438/710, 715–716, 729, 771, 776, 782, 438/788–789, 792–793, 798, 910, 972; 427/523–531, 534–540, 569–579, 8; 216/67, 87, 94; 118/723 E, 725, 728–732
See application file for complete search history.

(56) References Cited

U.S. PATENT DOCUMENTS

| | | | |
|---|---|---|---|
| 5,380,566 A | | 1/1995 | Robertson et al. |
| 5,699,223 A | * | 12/1997 | Mashiro .............. H01L 21/6831 |
| | | | 361/234 |

(Continued)

FOREIGN PATENT DOCUMENTS

| | | |
|---|---|---|
| JP | H03-044472 A | 2/1991 |
| JP | 2007-227816 A | 9/2007 |

OTHER PUBLICATIONS

Machine translation of JP 2007-227816 A1, by Koga Kazuhiro et al., published Sep. 2007.*

*Primary Examiner* — Marianne L Padgett
(74) *Attorney, Agent, or Firm* — Studebaker & Brackett PC

(57) ABSTRACT

Examples of a substrate processing method include subjecting a substrate placed on a susceptor to plasma processing, applying power to an RF electrode facing the susceptor for only a predetermined static electricity removal time to generate plasma, thereby reducing an amount of charge of the substrate, measuring a self-bias voltage of the RF electrode while susceptor pins are made to protrude from a top surface of the susceptor and lift up the substrate, and by a controller, shortening the static electricity removal time when the self-bias voltage has a positive value, and lengthening the static electricity removal time when the self-bias voltage has a negative value.

10 Claims, 7 Drawing Sheets

(56) References Cited

U.S. PATENT DOCUMENTS

| | | | |
|---|---|---|---|
| 10,504,697 B2 * | 12/2019 | Baek | C23C 16/503 |
| 2004/0259276 A1 * | 12/2004 | Yue | H01J 37/32935 |
| | | | 438/5 |
| 2005/0222781 A1 * | 10/2005 | Yue | G05B 13/041 |
| | | | 702/30 |
| 2006/0215338 A1 * | 9/2006 | Yokouchi | H01L 21/67253 |
| | | | 361/56 |
| 2009/0097185 A1 * | 4/2009 | Shannon | H01J 37/32091 |
| | | | 361/234 |
| 2009/0321391 A1 * | 12/2009 | Ichino | B44C 1/227 |
| | | | 216/61 |
| 2010/0248490 A1 * | 9/2010 | McMillin | H01J 37/32788 |
| | | | 438/716 |
| 2015/0123541 A1 * | 5/2015 | Baek | H01J 37/32532 |
| | | | 315/111.21 |
| 2015/0262794 A1 * | 9/2015 | Kihara | H01J 37/32091 |
| | | | 216/71 |
| 2018/0182656 A1 * | 6/2018 | Sato | H01L 21/6833 |

* cited by examiner

SUBSTRATE PROCESSING METHOD

TECHNICAL FIELD

Examples are described which relate to a substrate processing method.

BACKGROUND

After a film formation process, particularly in a high-power and low-temperature process, a Si substrate may stick to a susceptor serving as a cathode. It has been considered that when plasma is generated with radio frequency (RF) power and film formation is performed, a Si substrate is charged with electrical charges, so that the susceptor and the Si substrate electrostatically attract each other and stick to each other.

When susceptor pins are brought into contact with the back surface of the substrate to lift up the substrate under the state that the substrate sticks to the susceptor, the substrate is forcedly exfoliated from the susceptor, so that great force acts on the substrate. The great force acting on the substrate causes a transfer error of the substrate due to a displacement of the substrate, or damages the susceptor pins or the substrate.

In order to suppress sticking of the substrate to the susceptor, it is necessary that proper plasma post-processing is performed according to the amount of charge of the substrate to reduce the amount of charge of the substrate. That is, it is necessary to perform removal of static electricity according to the amount of charge of the substrate. The amount of charge of the substrate varies depending on the content of the plasma processing. For example, the amount of charge of the substrate varies depending on plasma irradiation time or power under film formation.

SUMMARY

Some examples described herein may address the above-described problems. Some examples described herein may provide a substrate processing method that can suppress a substrate from sticking to a susceptor by reducing the amount of charge of the substrate.

In some examples, a substrate processing method includes subjecting a substrate placed on a susceptor to plasma processing, applying power to an RF electrode facing the susceptor for only a predetermined static electricity removal time to generate plasma, thereby reducing an amount of charge of the substrate, measuring a self-bias voltage of the RF electrode while susceptor pins are made to protrude from a top surface of the susceptor and lift up the substrate, and by a controller, shortening the static electricity removal time when the self-bias voltage has a positive value, and lengthening the static electricity removal time when the self-bias voltage has a negative value.

DETAILED DESCRIPTION

A substrate processing method according to some examples will be described with reference to the drawings. The same or corresponding constituent elements are represented by the same reference signs, and duplicative descriptions thereof may be omitted.

Figure 1:
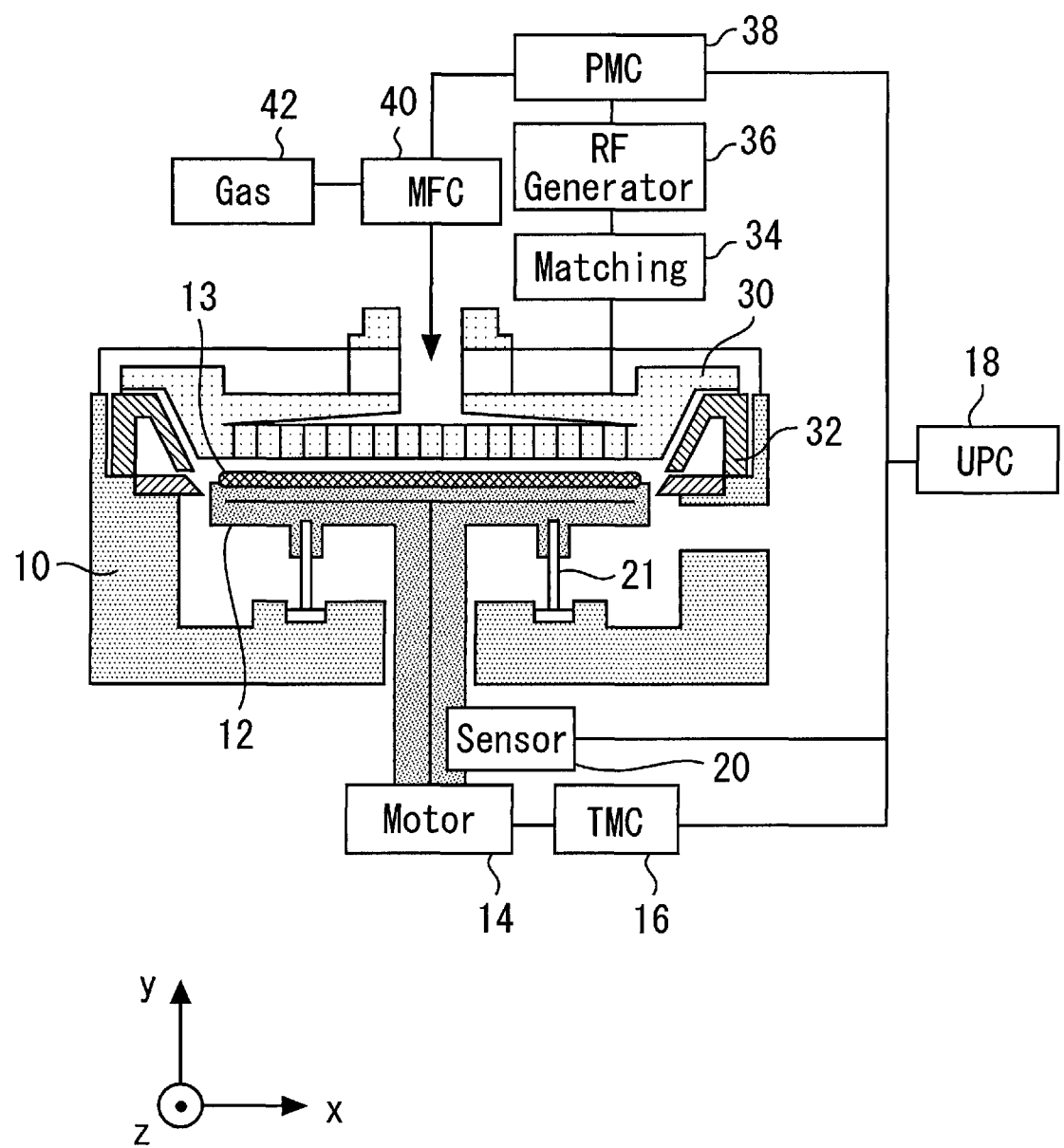
FIG. 1 is a diagram showing an exemplary configuration of a substrate processing apparatus.

FIG. 1 is a diagram showing an exemplary configuration of a substrate processing apparatus. A susceptor 12 is provided in a chamber 10. A substrate 13 as a processing target may be placed on the susceptor 12. The substrate 13 is, for example, an Si wafer. The susceptor 12 may be moved vertically by a driving unit 14. The driving unit 14 receives an instruction from UPS (Unique Platform Controller) 18 via TMC (Transfer Module Controller) 16, and moves the susceptor 12 vertically according to the instruction. A vibration sensor 20 for detecting vibration of the susceptor 12 is fitted to the susceptor 12.

The susceptor pins 21 are fixed to, for example, the chamber 10, and support the substrate 13 when the substrate 13 is transferred. When the susceptor 12 is located at a high position, the susceptor pins 21 are located below the top surface of the susceptor 12. When the susceptor 12 is located at a low position, the susceptor pins 21 protrude to an upper side of the top surface of the susceptor 12.

An RF electrode 30 is provided above the susceptor 12. The RF electrode 30 may be provided, for example, above an annularly-configured exhaust duct 32. The RF electrode 30 is provided so as to face the susceptor 12, thereby providing a parallel flat plate structure. The RF electrode 30 is provided with a through-hole. For example, gas which is subjected to flow rate control by a mass flow controller 40 is supplied from a gas source 42 filled with gas for film formation onto the substrate 13 via the through-hole of the RF electrode 30. An RF generator 36 is connected to the RF electrode 30 via a matching circuit 34. PMC (Process Module Controller) 38 receiving an instruction from UPC 18 controls the RF generator 36 and the mass flow controller 40.

As described above, the substrate processing apparatus shown in FIG. 1 can be configured as a plasma processing apparatus. The plasma processing is, for example, processing for forming a film on a substrate, reforming a film on a substrate or etching a part of a substrate.

Figure 2:
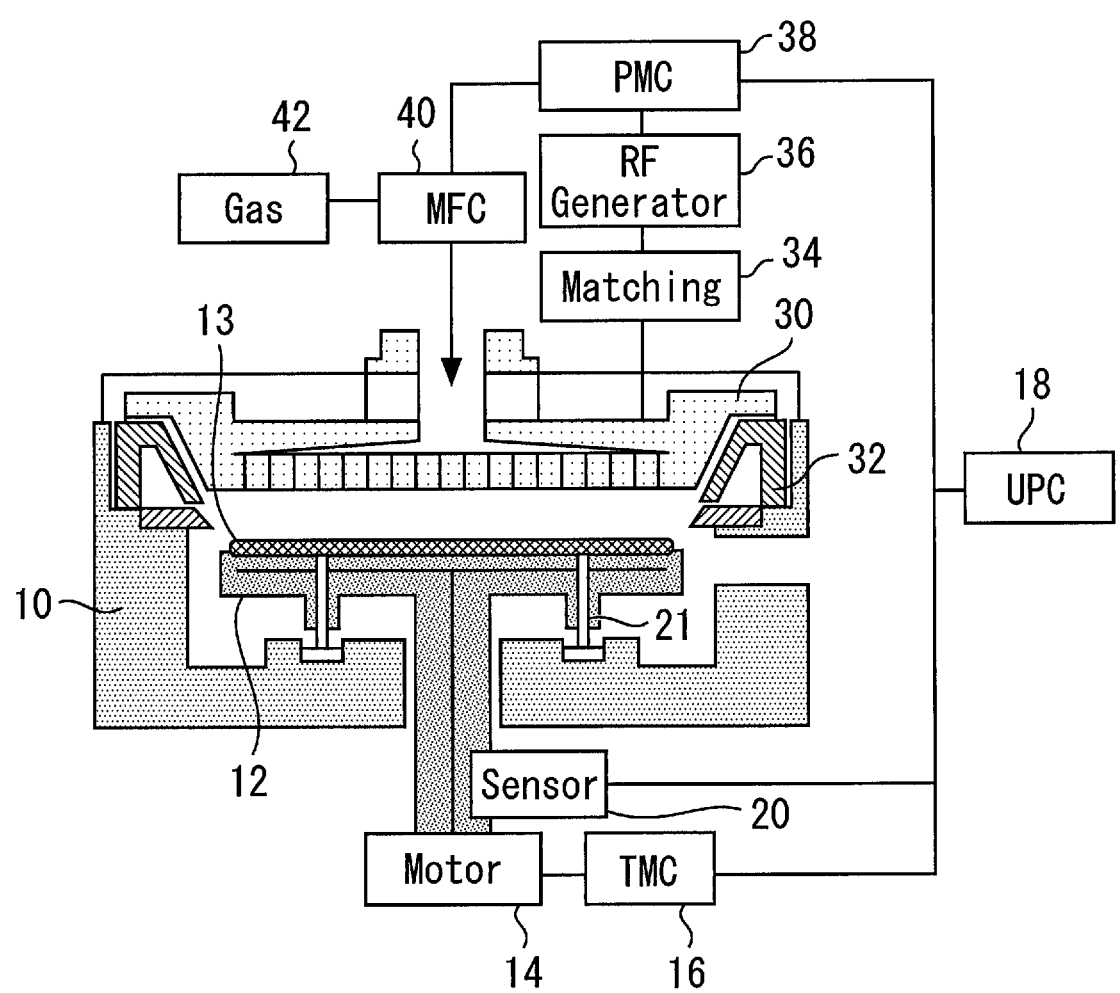
FIG. 2 is a diagram showing that the susceptor is moved downwards.
Figure 3:
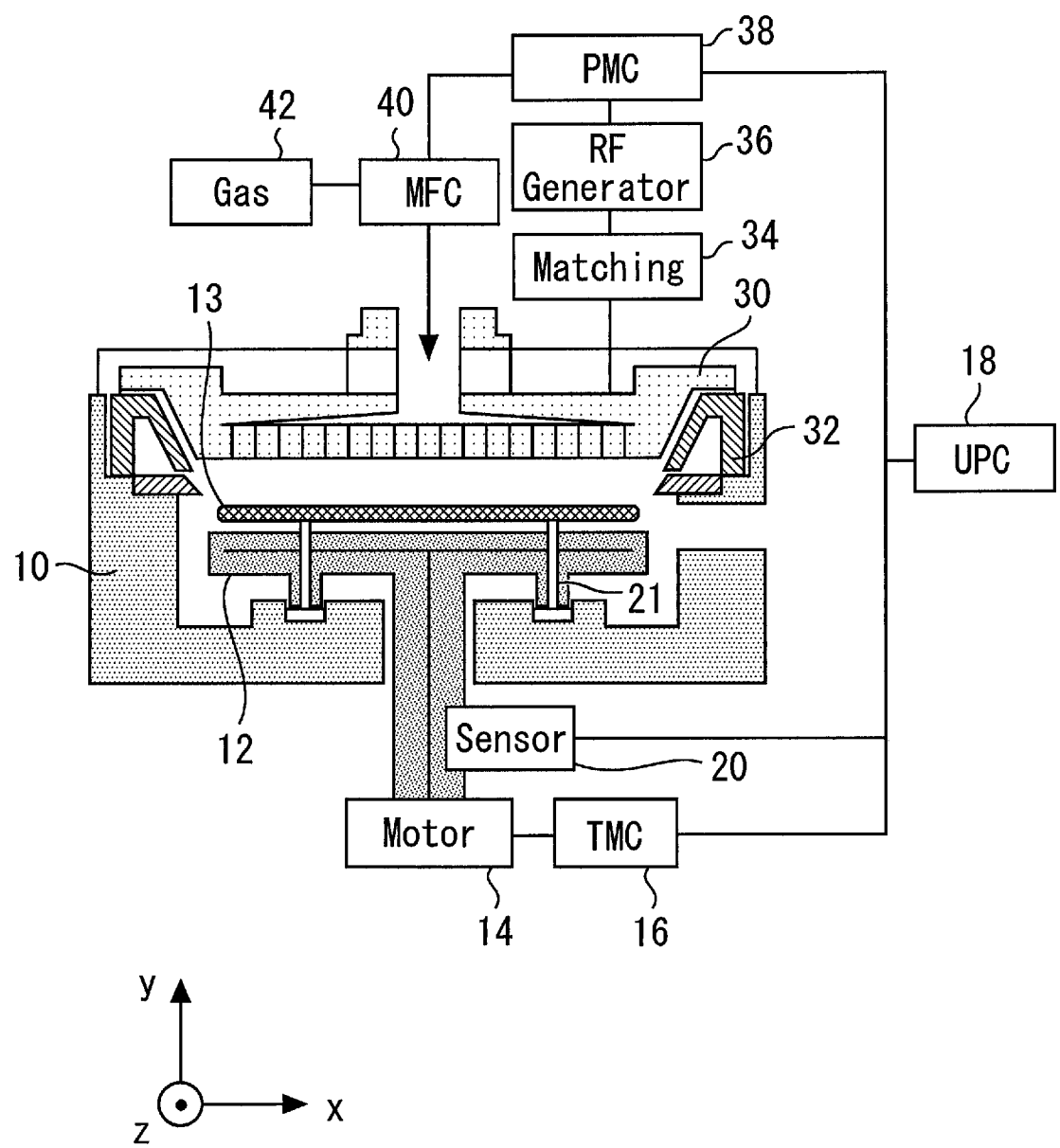
FIG. 3 is a diagram showing that the susceptor is further moved downwards.

FIG. 2 is a diagram showing that the susceptor 12 is moved downwards by the driving unit 14 as compared with the case of FIG. 1. The downward movement of the susceptor 12 brings the susceptor pins 21 into contact with the back surface of the substrate 13. FIG. 3 is a diagram showing that the susceptor 12 is further moved downwards by the driving unit 14. At this time, the susceptor 12 is separated from the substrate 13, and the substrate 13 is supported by only the susceptor pins 21. A transfer arm is inserted between the substrate 13 and the susceptor 12, and moved upwards, whereby the substrate 13 is allowed to be supported and transferred by the transfer arm.

Figure 4:
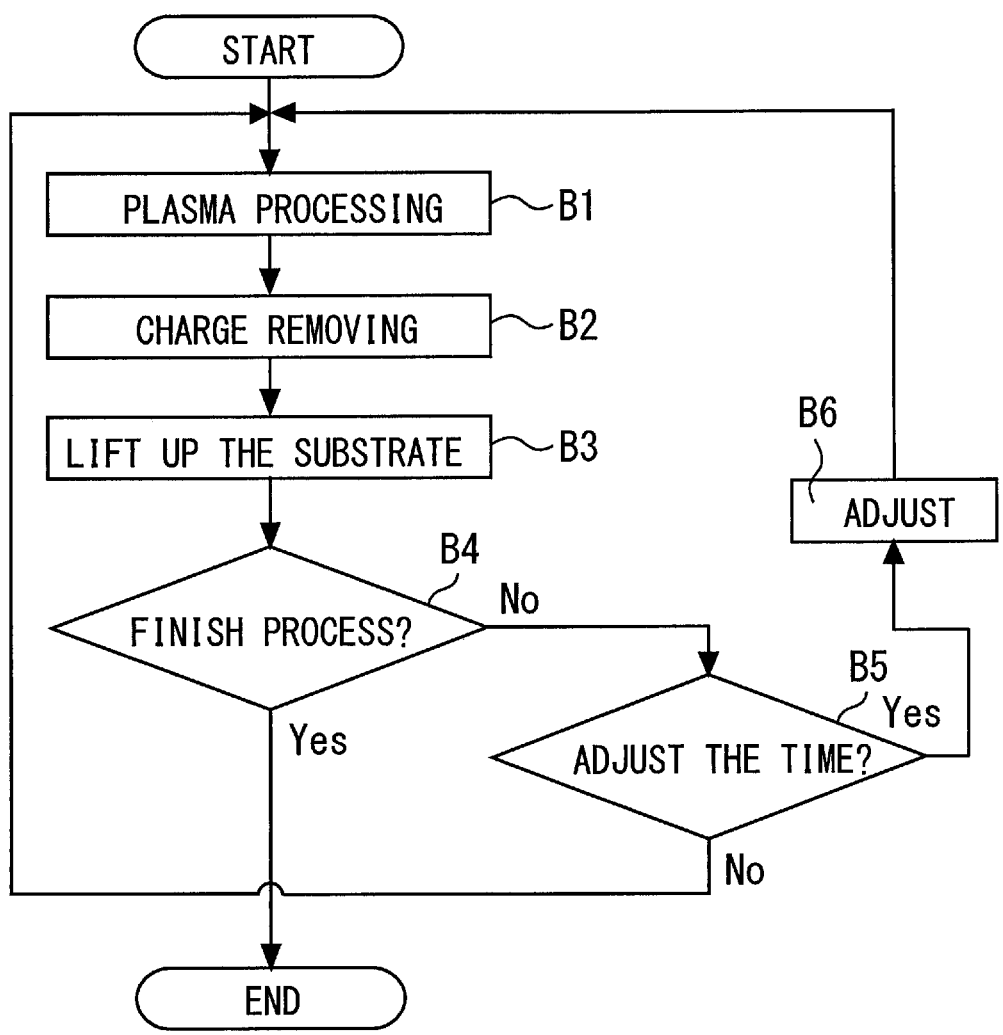
FIG. 4 is a flowchart showing an example of the substrate processing method.

FIG. 4 is a flowchart showing an example of the substrate processing method. In this example, in block B1, the plasma processing is first performed on the substrate 13 placed on the susceptor 12. In the plasma processing, for example, AC power is applied to the RF electrode 30 while reaction gas is supplied into the gap between the RF electrode 30 and the susceptor 12, thereby generating plasma and forming a film on the substrate. Another processing using plasma may be performed. The substrate 13 is charged with electrical charges by this plasma processing.

Next, in block B2, the amount of charge of the substrate is reduced. This processing may be also called as removal of static electricity. In this case, power is applied to the RF electrode 30 for only a predetermined static electricity removal time to generate plasma, thereby reducing the amount of charge of the substrate 13. Gas to be supplied may be inert gas or reaction gas. For example, plasma to be supplied for removal of static electricity may be inert gas plasma. The term of "removal of static electricity" contains not only perfect removal of static electricity, but also reduction of the amount of charge.

Figure 5:
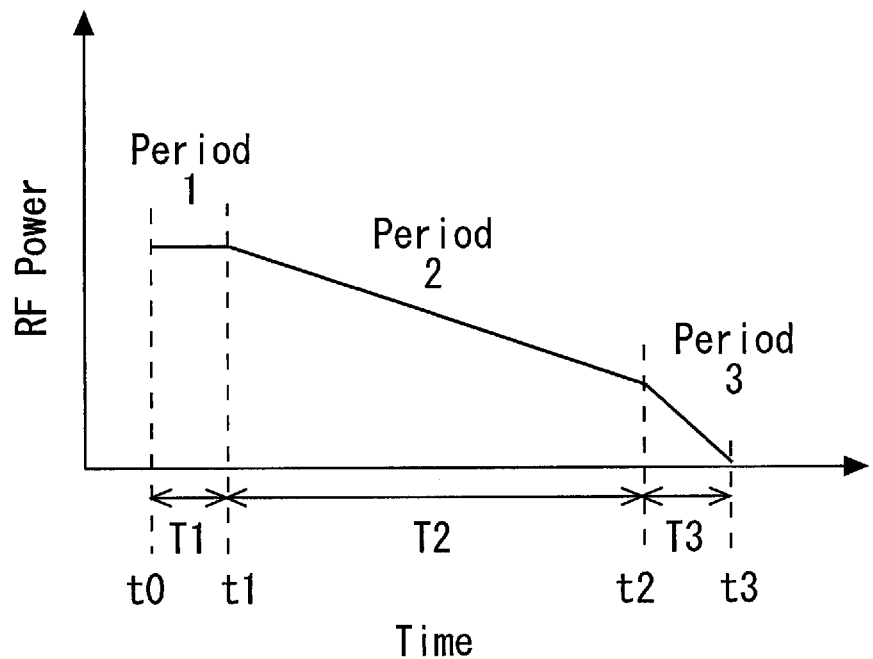
FIG. 5 is a diagram showing an example of application of RF power.

FIG. 5 is a diagram showing an example of application of RF power under removal of static electricity. The static electricity removal time contains, for example, a first time T1, a second time T2 and a third time T3. The first time T1 is a period of time from time t0 to time t1. The first time T1 is a period of time during which power is applied to the RF electrode 30 to generate plasma. The first time T1 may be set to any period of time before plasma has stabilized. The first time T1 is set to, for example, 3 seconds.

The second time T2 is a period of time from time t1 to time t2. For the second time T2, the power of the RF electrode 30 is reduced at a predetermined first rate. For example, RF power of 140 V is reduced to 110 V in 20 seconds. The third time T3 is a period of time from time t2 to time t3. For the third time T3, the power of the RF electrode 30 is reduced down to 0 V at a predetermined second rate. For example, the RF power of 110 V is reduced to 0 V in 5 seconds. Plasma irradiation is performed while changing the RF power by the foregoing three steps, whereby the amount of charge of the substrate 13 can be reduced. The RF power may be changed by another method.

Subsequently, in block B3, the susceptor pins 21 are made to protrude from the top surface of the susceptor 12 and lift up the substrate 13. A self-bias voltage of the RF electrode 30 is measured during a certain period containing a moment at which the substrate 13 is lifted up.

The self-bias voltage will be described. First, the difference between the maximum and minimum voltages of an AC voltage applied to the RF electrode 30 is known as VPP (Volt peak to peak). VPP can be used for monitoring, etc. of a process in handling radio frequency plasma. Specifically, the matching circuit 34 is provided with a VPP sensor, and the value of VPP obtained by the VPP sensor can be monitored by UPC 18 or the like. A voltage which is a middle point of VPP is called as a self-bias voltage or Vdc (Volt Direct Current). For example, Vdc can be generated by providing a blocking capacitor to the matching circuit used for an RF power supply. The self-bias voltage is measured at all times, for example, in order to monitor the state of plasma during film formation, and stored in a PLC logger. The self-bias voltage during film formation is normally minus.

Figure 6:
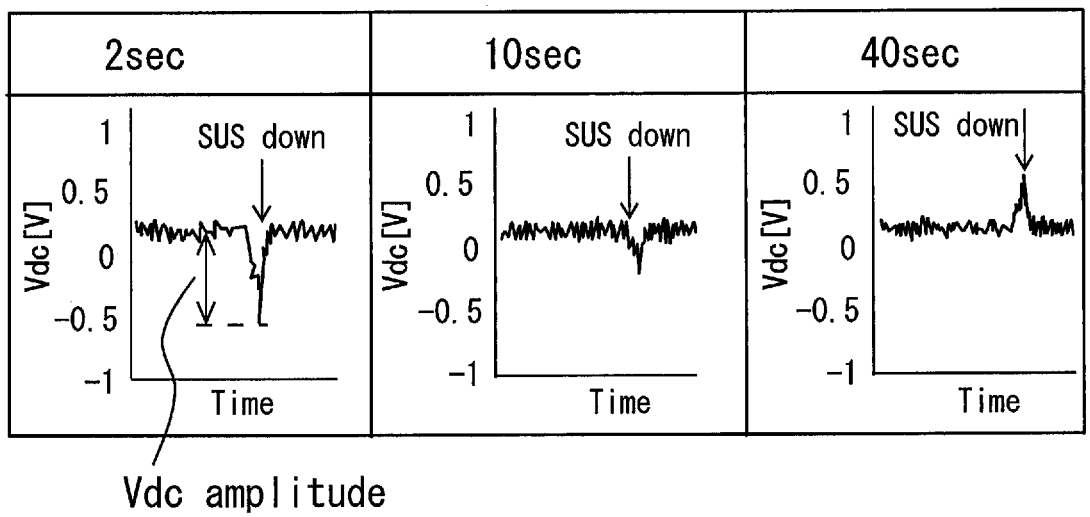
FIG. 6 is a diagram showing an example of the self-bias voltage.

FIG. 6 is a diagram showing an example of the self-bias voltage measured in the processing of the block B3 of FIG. 4. FIG. 6 shows self-bias voltages when the susceptor pins 21 are made to protrude from the susceptor 12 and lift up the substrate 13 after removal of static electricity is performed with the second time T2 set to 2 seconds, 10 seconds and 40 seconds. For example, when the self-bias voltage is measured after the removal of static electricity is performed with the second time T2 set to 2 seconds, the self-bias voltage temporarily decreases down to about −0.7 V. The difference between a base voltage and a peak voltage is represented as Vdc amplitude. When the self-bias voltage is measured after the removal of static electricity is performed with the second time T2 set to 10 seconds, the self-bias voltage temporarily decreases down to about −0.2 V. When the self-bias voltage is measured after the removal of static electricity is performed with the second time T2 set to 40 seconds, the self-bias voltage temporarily increases up to about 0.6 V. As described above, by adjusting the length of the second time T2, for example, the amount of charge of the substrate 13 as a film processing target can be controlled.

The amount of charge of the substrate 13 is larger as a variation amount of the self-bias voltage when the substrate 13 is lifted up by the susceptor pins 21 is larger. In other words, the substrate 13 is in closer contact with the susceptor 12 and the charge amount [C/m$^2$] of the substrate 13 is larger as the absolute value of the self-bias voltage when the substrate 13 is lifted up by the susceptor pins 21 is larger. In order to suppress a trouble caused by sticking of the substrate 13 to the susceptor 12, the amount of charge of the substrate 13 should be reduced by removal of static electricity to reduce the self-bias voltage (Vdc) when the substrate 13 is lifted up by the susceptor pins 21.

Figure 7:
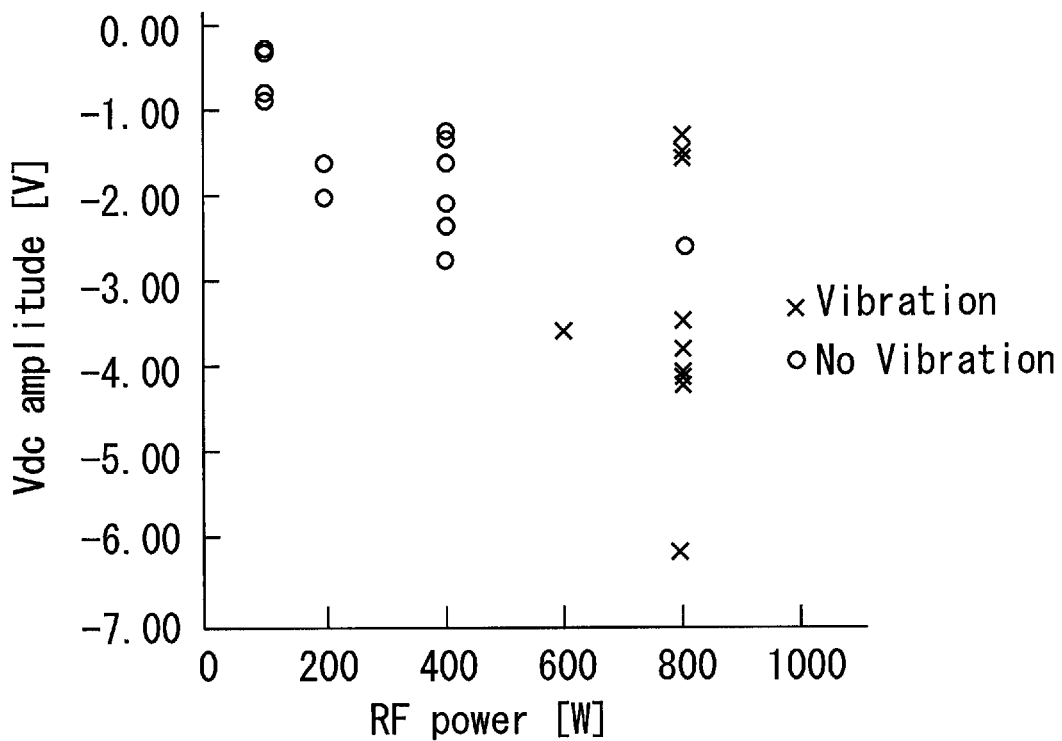
FIG. 7 is a diagram showing the relationship between the presence or absence of sticking of the substrate and Vdc amplitude.

FIG. 7 is a diagram showing the relationship between the presence or absence of sticking of the substrate and Vdc amplitude when the substrate 13 is lifted up by the susceptor pins 21. The abscissa axis represents the RF power adopted in the plasma processing on the substrate. The ordinate axis represents Vdc amplitude. For example, as shown in FIG. 6, Vdc amplitude represents a variation amount of the self-bias voltage when the substrate is lifted up by the susceptor pins. At positions indicated by "x", the substrate 13 sticks to the susceptor 12, so that the susceptor 12 vibrates in connection with the lift-up of the substrate 13 by the susceptor pins 21. At positions represented by "o", there is not detected any vibration in connection with the lift-up of the substrate 13 by the susceptor pins 21. The vibration of the susceptor 12 can be detected, for example by the vibration sensor 20 of FIG. 1.

Figure 8:
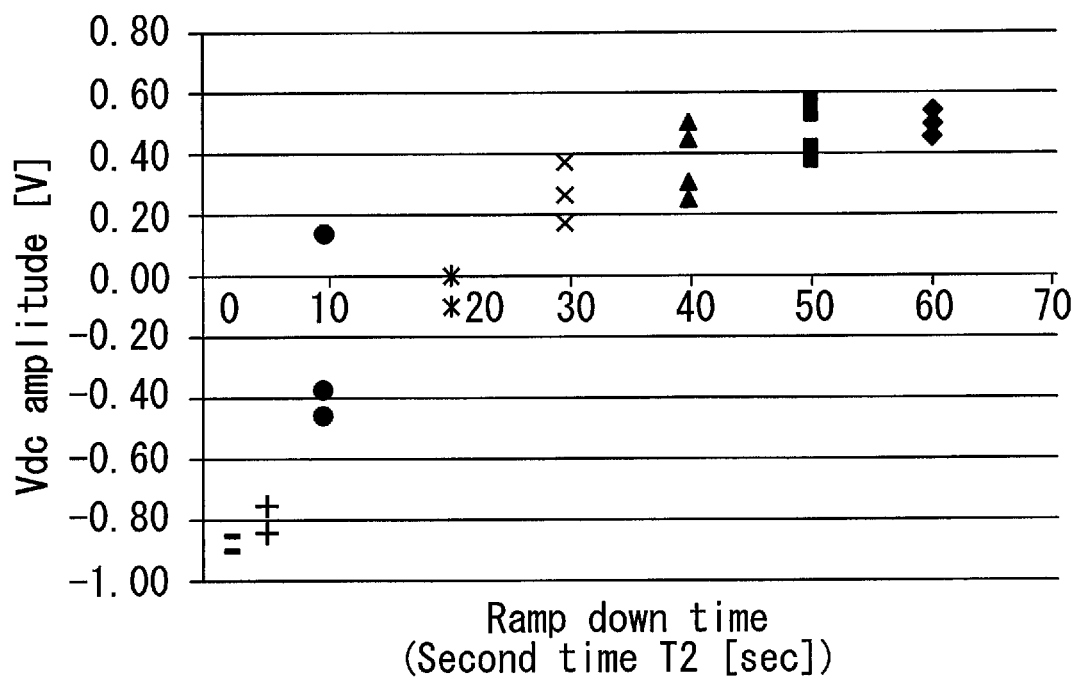
FIG. 8 is a diagram illustrating the relationship between the length of the second time and Vdc amplitude.

It is apparent from FIG. 7 that when Vdc amplitude is equal to −1 or less, the substrate 13 is apt to stick to the susceptor 12. FIG. 8 is a diagram illustrating the relationship between the length of the second time T2 and Vdc amplitude. When the second time T2 is set to about 20 seconds, Vdc amplitude is equal to substantially zero. Therefore, it is apparent that the substrate 13 has been subjected to sufficient removal of static electricity. However, the absolute value of Vdc amplitude increases even when the second time T2 is made more or less than 20 seconds. In the example of FIG. 8, Vdc amplitude varies from a negative value to a positive value with increase of the second time T2. In this case, significant charges remain in the substrate 13 after removal of static electricity even when the second time T2 is made more or less than 20 seconds. In this example, Vdc amplitude equal to substantially zero is achieved when second time T2 is set to about 20 seconds. However, other second time T2 may be used in other example depending on the amount of charge.

Next, in block B4, it is determined whether the process is finished or not. When there is no substrate to be processed, the determination goes to "Yes" to finish the processing. When a new substrate should be processed, the determination goes to "No".

When it is determined in block B4 that it is necessary to process a new substrate, the processing goes to block B5. In block B5, the static electricity removal time is adjusted according to the self-bias voltage measured in block B3 if necessary. Such an adjustment may be performed, for example, by UPC 18 functioning as a controller. For example, the controller shortens the static electricity removal time when the self-bias voltage has a positive value, and lengthens the static electricity removal time when the self-bias voltage has a negative value. More specifically, when the self-bias voltage has a positive value, the second time T2 may be shortened, and when the self-bias voltage has a negative value, the second time T2 may be lengthened. The static electricity removal time after the adjustment may be applied to the removal of static electricity for a next substrate.

When the self-bias voltage measured at the lift-up time of the substrate 13 by the susceptor pins 21 has a positive value, it is necessary to shorten the second time T2 in the case of the example of FIG. 8. On the other hand, when the self-bias voltage measured at the lift-up time of the substrate 13 by the susceptor pins 21 has a negative value, it is necessary to lengthen the second time T2 in the case of the example of FIG. 8. As described above, the second time T2 to be applied to a next substrate is determined in the controller so as to sufficiently remove the static electricity of the next substrate. In block B6, the foregoing adjustment of the second time T2 is performed. For example, the second time T2 stored in a storage unit of the controller is updated.

Thereafter, the foregoing series of processing is performed on the new substrate by using the adjusted second time T2. Describing briefly, the same plasma processing as the plasma processing performed on a processed substrate is performed on a new substrate, so that charges occur in the new substrate. Then, the new substrate is subjected to removal of static electricity with the adjusted second time T2, whereby the amount of charge of the substrate can be sufficiently reduced. Therefore, the substrate can be suppressed from sticking to the susceptor.

The gist of the removal of static electricity shown in FIG. 4 may be changed. For example, the second time T2 is set to be longer than the third time T3, but the time in each stage may be changed. When plasma processing having the same content is performed on a substrates to be successively processed, the second time T2 after the adjustment may be continuously used. Accordingly, when the second time T2 is adjusted once, the adjustment of the second time T2 can be omitted insofar as the same plasma processing is performed. On the other hand, the second time which has been precisely adjusted can be obtained by adjusting the second time in all the processing for the substrate or adjusting the second time in a certain cycle.

According to this substrate processing method, data representing the relationship between the static electricity removal time and Vdc amplitude are accumulated as the substrate processing is more repeated. Accordingly, the controller does not adjust the static electricity removal time by referring to only the latest data, but can optimize the static electricity removal time by referring to the whole accumulated data. The static electricity removal time can be optimized and the amount of charge of the substrate can be sufficiently reduced by using the data of the self-bias voltage which is successively obtained.

Change of a recipe is assumed in the substrate processing. When a recipe for substrate processing is changed, the controller may change the static electricity removal time according to the recipe. That is, the controller may adjust the static electricity removal time for each recipe, and store and use the static electricity removal time adjusted for each recipe.

It is apparent from FIG. 7 that the substrate is more apt to stick to the susceptor as the plasma power of the plasma processing is greater. That is, the amount of charge of the substrate becomes larger as the plasma power of the plasma processing is greater. Therefore, the controller may more lengthen the static electricity removing time as the plasma power of the plasma processing is greater.

Figure 9:
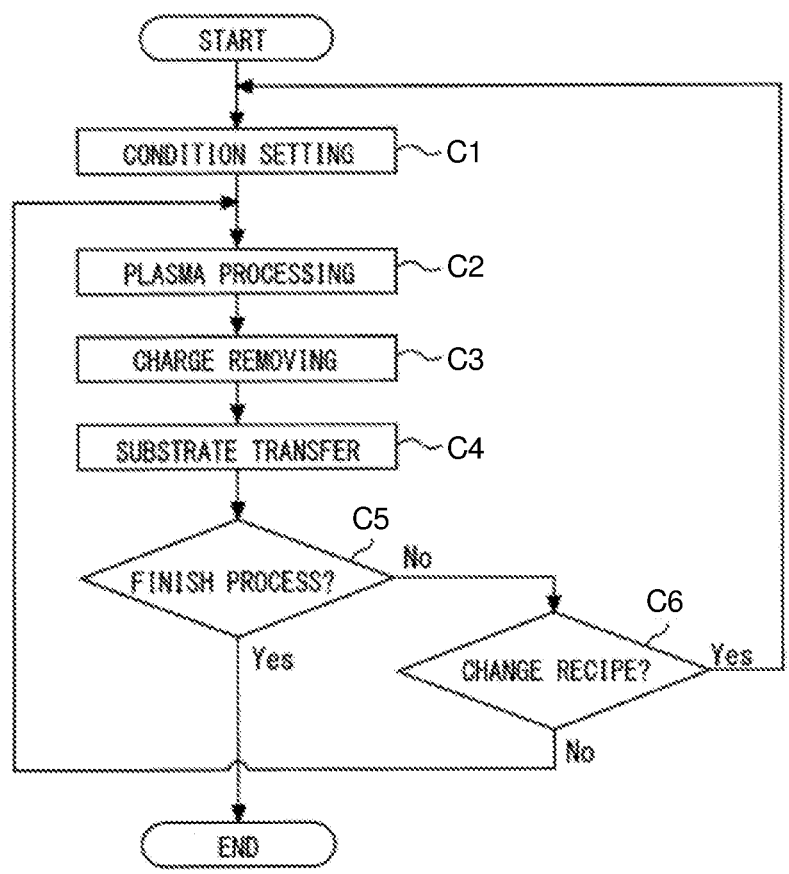
FIG. 9 is flowchart showing a substrate processing method.

FIG. 9 is a flowchart showing a substrate processing method according to another example. In block C1, a condition setting for an optimal static electricity removal time is performed. In this condition setting, the plasma processing, the static electricity removal processing and the measurement of the self-bias voltage are performed at plural times while the static electricity removal time is changed. For example, a first substrate placed on the susceptor 12 is first subjected to plasma processing. Subsequently, power is applied to the RF electrode 30 for only a predetermined static electricity removal time to reduce the amount of charge of the first substrate. Subsequently, the susceptor 12 is downwards moved so that the susceptor pins 21 are made to protrude from the top surface of the susceptor 12 and lift up the first substrate, and the self-bias voltage of the RF electrode 30 at that time is measured. Thereafter, the static electricity removal time is changed, and a series of processing is performed on another first substrate. The relationship between the static electricity removal time and Vdc amplitude is obtained by repeating the above operation. For example, the relationship between the static electricity removal time and Vdc amplitude as shown in FIG. 8 is obtained.

Subsequently, in block C2, the same plasma processing as the plasma processing for the first substrate is performed on a second substrate. Subsequently, the second substrate is subjected to the static electricity removal in block C3. In this static electricity removal, power is applied to the RF electrode 30 for only a static electricity removal time which provides a self-bias voltage having a minimum absolute value among self-bias voltages obtained by measuring the self-bias voltage at plural times for the first substrate. For example, the static electricity removal time which provides the self-bias voltage having the minimum absolute value is selected in advance in block C1, and the static electricity removal in block C3 may be performed for the selected static electricity removal time.

Subsequently, in block C4, after the amount of charge of the second substrate is reduced by the foregoing processing, the second substrate is lifted up by the susceptor pins 21, and transferred by the transfer arm. Subsequently, it is determined in block C5 whether the processing for the substrate is finished or not. When the substrate processing is continued, it is checked in block C6 whether the recipe should be changed or not. When there is no change to the recipe, the static electricity removal time obtained in block C1 is applied to a new substrate. On the other hand, when there is any change to the recipe, the processing goes to the block C1, a condition setting to obtain an optimum static electricity removal time for the changed recipe is performed according to the foregoing gist.

For example, the first substrate is a dummy substrate, and the second substrate is a product substrate. For example, the first time, the second time and the third time described in FIG. 5 may be adopted for the process of reducing the RF power for the static electricity removal time. In this example, the second time is longer than the third time.

The Vdc amplitude at the timing when the substrate 13 is lifted up by the susceptor pins 21 may be measured, and the static electricity removal time may be adjusted by a method different from the foregoing method so that the Vdc amplitude approaches to zero. For example, the data of the Vdc amplitude may be used for feedback control or feedforward control. The static electricity removal time is configured by three steps, but it may be changed to another content.

The configuration of the substrate processing apparatus may be changed to any configuration capable of performing plasma processing. For example, a plasma assist film formation apparatus for performing processing such as PEALD or PECVD may be used as the substrate processing apparatus.

The invention claimed is:

1. A substrate processing method comprising:
   plasma processing a substrate placed on a susceptor;
   applying power to an RF electrode facing the susceptor for only a first predetermined static electricity removal time to generate a plasma after the plasma processing, thereby reducing an amount of charge of the substrate;
   measuring a self-bias voltage of the RF electrode after generation of the plasma while susceptor pins are made to protrude from a top surface of the susceptor and lift up the substrate; and
   by a controller that is configured to shorten static electricity removal time based entirely on the self-bias voltage and to lengthen static electricity removal time based entirely on the self-bias voltage, shortening a subsequent static electricity removal time when the self-bias voltage has a positive value, and lengthening the subsequent static electricity removal time when the self-bias voltage has a negative value, and after the subsequent static electricity removal time has been lengthened or shortened, plasma processing a subsequent substrate placed on the susceptor followed by applying the power to the RF electrode facing the susceptor for the subsequent static electricity removal time.

2. The substrate processing method according to claim 1, wherein each of the static electricity removal times includes:
   a respective first time for which the power is applied to the RF electrode to generate the plasma;
   a respective second time for which the power applied to the RF electrode is decreased at a predetermined first rate after the first time has elapsed; and
   a respective third time for which the power applied to the RF electrode is decreased down to 0 at a predetermined second rate after the second time has elapsed.

3. The substrate processing method according to claim 2, wherein the controller shortens the second time of the subsequent static electricity removal time when the self-bias voltage has the positive value, and lengthens the second time of the subsequent static electricity removal time when the self-bias voltage has the negative value.

4. The substrate processing method according to claim 2, wherein the second time is longer than the third time.

5. The substrate processing method according to claim 1, wherein the controller changes the subsequent static electricity removal time according to a recipe for processing the subsequent substrate.

6. The substrate processing method according to claim 1, wherein the controller makes the subsequent static electricity removal time longer as plasma power of the plasma processing is increased.

7. A substrate processing method comprising:
   plasma processing a first substrate of a set of first substrates placed on a susceptor, then applying power to an RF electrode facing the susceptor for only a predetermined static electricity removal time to reduce an amount of charge of the first substrate by generating plasma, and then measuring at least a first self-bias voltage of a plurality of self-bias voltages of the RF electrode when susceptor pins are made to protrude from a top surface of the susceptor and lift up the first substrate while the predetermined static electricity removal time is changed to a first subsequent static electricity removal time to be used for a subsequent first substrate of the set of first substrates and then plasma processing the subsequent first substrate of the set of first substrates placed on the susceptor, then applying the first subsequent static electricity removal time to the subsequent first substrate of the set of first substrates, and then measuring at least a second self-bias voltage of a plurality of self-bias voltages of the RF electrode when susceptor pins are made to protrude from the top surface of the susceptor and lift up the subsequent first substrate;
   determining from the plurality of self-bias voltages a self-bias voltage having a minimum absolute value;
   subjecting a second substrate placed on the susceptor to the same plasma processing as the plasma processing for the subsequent first substrate; and
   determining a second subsequent static electricity removal time from the self-bias voltage having the minimum absolute value, and applying the power to the RF electrode for only the second subsequent determined static electricity removal time, thereby reducing an amount of charge of the second substrate.

8. The substrate processing method according to claim 7, wherein each of the first substrates is a dummy substrate, and the second substrate is a product substrate.

9. The substrate processing method according to claim 7, wherein each of the static electricity removal times includes:
   a first time for which the power is applied to the RF electrode to generate the plasma;
   a second time for which the power applied to the RF electrode is decreased at a predetermined first rate after the first time has elapsed; and
   a third time for which the power applied to the RF electrode is decreased down to 0 at a predetermined second rate after the second time has elapsed.

10. The substrate processing method according to claim 9, wherein the second time is longer than the third time.

* * * * *